(12) United States Patent
Andreev et al.

(10) Patent No.: US 8,209,589 B2
(45) Date of Patent: Jun. 26, 2012

(54) REED-SOLOMON DECODER WITH A VARIABLE NUMBER OF CORRECTABLE ERRORS

(75) Inventors: Alexandre Andreev, San Jose, CA (US); Ilya Neznanov, Moscow (RU); Elyar Gasanov, Moscow (RU); Pavel Panteleev, Moscow (RU)

(73) Assignee: LSI Corporation, Milpitas, CA (US)

( * ) Notice: Subject to any disclaimer, the term of this patent is extended or adjusted under 35 U.S.C. 154(b) by 952 days.

(21) Appl. No.: 12/212,022

(22) Filed: Sep. 17, 2008

(65) Prior Publication Data

US 2010/0070832 A1    Mar. 18, 2010

(51) Int. Cl.
*H03M 13/00* (2006.01)
(52) U.S. Cl. ........................ 714/784; 714/785
(58) Field of Classification Search ........... 714/784–785
See application file for complete search history.

(56) References Cited

U.S. PATENT DOCUMENTS

| | | | |
|---|---|---|---|
| 5,444,719 A | 8/1995 | Cox et al. | |
| 6,047,395 A | 4/2000 | Zook | |
| 6,446,236 B1 * | 9/2002 | McEwen et al. | 714/795 |
| 7,082,564 B2 | 7/2006 | Fredrickson et al. | |
| 2003/0126544 A1 * | 7/2003 | Dadurian | 714/785 |
| 2005/0278610 A1 * | 12/2005 | Banks | 714/784 |

* cited by examiner

*Primary Examiner* — Guy Lamarre
(74) *Attorney, Agent, or Firm* — Alexander J. Neudeck; Cochran Freund & Young LLC

(57) ABSTRACT

A syndrome calculator receives an input codeword and calculates a first set of syndromes. A syndrome transform receives the first set of syndromes having and determines a second set of syndromes. The second set of syndromes is based on the first set of syndromes. The second set of syndromes has number of syndromes that is less than the number of syndromes in the first set of syndromes. A key equation solver receives the second set of syndromes and produces an indication of zero or more error locations and an indication of zero or more error values.

18 Claims, 3 Drawing Sheets

REED-SOLOMON DECODER WITH A VARIABLE NUMBER OF CORRECTABLE ERRORS

BACKGROUND

An error-correcting code (ECC) or forward error correction (FEC) code are codes where each data signal conforms to specific rules of construction so that errors in the received signal can be detected and corrected. These codes are often used in computer data storage and in data transmission.

A powerful class of error-correcting codes are Reed-Solomon (RS) codes. Reed-Solomon error correction is works by constructing a polynomial from the data. The coefficients of this polynomial are sent or recorded. As long as the receiver gets many of the coefficients correctly, the receiver can recover the original polynomial even in the presence of a few erroneous coefficients.

Reed-Solomon codes are used in a wide variety of commercial applications. For example, Reed-Solomon codes are used in CDs and DVDs. Reed-Solomon codes are also used in data transmission technologies such as Digital Subscriber Loop (DSL), WiMAX, Digital Video Broadcasting (DVB), and digital television.

SUMMARY

An embodiment may therefore comprise a Reed-Solomon decoder, comprising: a syndrome calculator that receives an input codeword and calculates a first set of syndromes; a syndrome transform that receives the first set of syndromes having a first number of syndromes and determines a second set of syndromes based on the first set of syndromes, wherein the second set of syndromes has a second number of syndromes, and wherein the first number of syndromes is greater than the second number of syndromes; and, a key equation solver that receives the second set of syndromes and produces an indication of zero or more error locations and an indication of zero or more error values.

Another embodiment may therefore comprise a method of Reed-Solomon decoding, comprising: receiving a first codeword having a first number of information symbols and a second number of redundant symbols; determining a first set of syndromes having a third number of syndromes equal to the second number plus the first number; determining a second set of syndromes, wherein the number of syndromes in the second set of syndromes is equal to the second number; and, based on the second set of syndromes, determining an indication of zero or more error locations and an indication of zero or more error values.

Another embodiment may therefore comprise. A method of transforming syndromes, comprising: receiving a first indicator of a first number of redundant symbols having a non-zero symbol value; determining a set of transform coefficients based on the first number; receiving a first set of syndromes; and, determining a second set of syndromes based on the first set of syndromes and the set of transform coefficients, wherein the first set of syndromes has a first number of syndromes, the second set of syndromes has a second number of syndromes, and the first number is greater than the second number.

DETAILED DESCRIPTION

Figure 1:
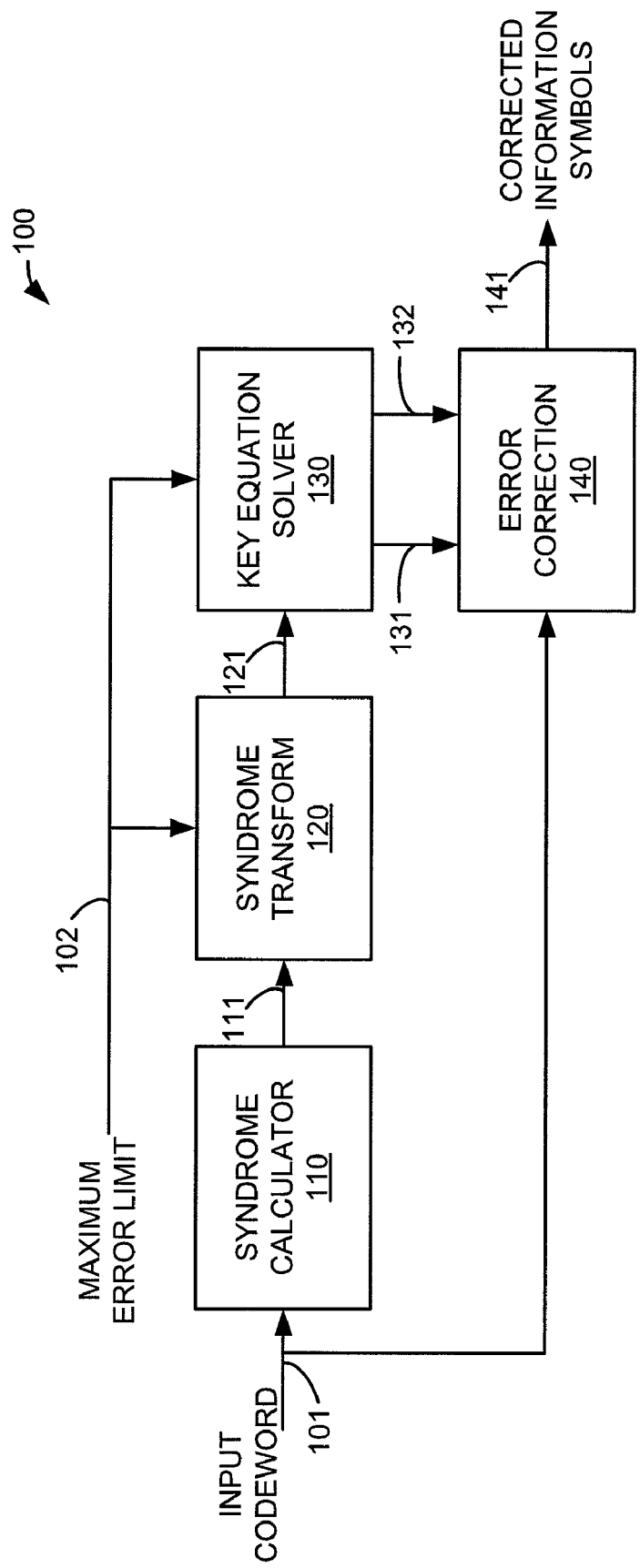
FIG. 1 is a block diagram illustrating a Reed-Solomon decoder.

FIG. 1 is a block diagram illustrating a Reed-Solomon decoder. Reed-Solomon decoder 100 comprises: syndrome calculator 110; syndrome transform 120; key equation solver 130; and error correction 140. Syndrome calculator 110 receives input codeword 101. Input codeword 101 is comprised of a set of information symbols and a set of redundant symbols. Redundant symbols may also be known as parity symbols.

In an embodiment, input codeword 101 may also includes a set of zero symbols in redundant symbol positions. This set of zero symbols are appended to a smaller input codeword in redundant symbol positions to bring the total number of symbols in input codeword 101 up to a size that syndrome calculator 110 or Reed-Solomon decoder 100 is expecting. For example, if Reed-Solomon decoder 100 is configured to receive at most a RS(255,239) code, and input codeword 101 is a codeword that was encoded with a RS(247,239) code, then eight (8) redundant symbol positions of input codeword 101 may be set to zero symbol values.

Syndrome calculator 110 produces a first set of syndromes 111 based on input codeword 101. Syndrome transform 120 receives the first set of syndromes 111. Syndrome transform 120 produces a second set of syndromes 121 based on the first set of syndromes 111. Syndrome transform 120 also receives an indicator of a maximum error limit 102. In an embodiment, syndrome calculator 110 produces the first set of syndromes 111 based on input codeword 101 that does not have a set of zero symbols appended in redundant symbol positions.

Key equation solver 130 receives the second set of syndromes 121. Key equation solver 130 produces at least one indication of an error location 131 and at least one indication of an error value 132. Key equation solver 130 also receives the indicator of maximum error limit 102. Error correction 140 receives the indication of an error location 131 and the indication of an error value 132. Error correction 140 also receives input codeword 101. Error correction 140 produces corrected information symbols 141 based on the indication of an error location 131, the indication of an error value 132, and the input codeword 101.

The indicator of maximum error limit 102 tells syndrome transform 120 and key equation solver 130 the maximum number of actual errors that can be corrected. From this information, syndrome transform 120 and key equation solver 130 may deduce how many of the redundant symbol positions in input codeword 101 contain non-zero redundant symbols, and how many contain zero symbol values. For example, if Reed-Solomon decoder 100 is configured to receive at most a RS(255,239) code, and input codeword 101 is a codeword that was encoded with a RS(247,239) code, then the indicator of maximum error limit 102 would tell syndrome transform 120 and key equation solver 130 that at most four ((247−239)÷2=4) errors can be corrected. Syndrome transform 120 and key equation solver 130 may deduce from this that eight (255−(4*2)−247=8) redundant symbol positions of input codeword 101 would be set to zero symbol values and eight (4*2=8) would contain non-zero values.

In general, syndrome calculator 10, key equation solver 130 and error correction 140 function like a conventional Reed-Solomon syndrome calculator, key equation solver, and error correction blocks, respectively. Key equation solver 130 may use or implement either the Berlekamp-Massey algorithm or the Euclidean algorithm. However, because key equation solver 130 receives the indication of maximum error limit 102, key equation solver 130 need not produce an indication of error location 131 or an indication of error value 132 for those redundant symbol positions that contained the appended zero symbol values.

Syndrome transform 120 transforms the first set of syndromes 111 into the second set of syndromes 121. Syndrome transform 120 accomplishes this transformation by multiplying each of the first set of syndromes by a corresponding transform coefficient. These transform coefficients are based on the coefficients of the polynomial:

$$\Psi(x) = \prod_{i=1}^{2t-2k} (x - B_i)$$

where t is the maximum number of errors that Reed-Solomon decoder 120 can be configured to correct, and k is the maximum number of errors that input codeword 101 is encoded to correct. The set of $B_i$ are indicators of the location of the additional zero value redundant symbols in input codeword 101 that were added. The $\Psi(x)$ polynomial may be referred to as an erasure polynomial.

The value of k may be provided by, or calculated from, the indicator of maximum error limit 102. The value of t may be calculated from the indicator of maximum error limit 102 and a maximum number of redundant symbols that Reed-Solomon decoder 100 may be configured to receive. For example, if the maximum number of redundant symbols that Reed-Solomon decoder 100 may be configured to receive is from an RS(255,239) code, then t=(255−239)/2=8.

The transform coefficients, denoted $\Psi_i$, are determined according to the equation:

$$\prod_{i=1}^{2t-2k} (x - B_i) = \sum_{i=0}^{2t-2k} \psi_i x^{2t-2k-i}.$$

The first set of syndromes 111 is denoted $S_i$ where: $S_i=(S_0, S_1 \ldots S_{2t-1})$. The second set of syndromes 121 is denoted $\tilde{S}$, where $\tilde{S}_i=(\tilde{S}_0, \tilde{S}_1, \ldots \tilde{S}_{2k-1})$. The second set of syndromes 121 is created according to:

$$\tilde{S}_i = \sum_{i=0}^{2t-2k} \psi_r S_{i+(2t-2k)-r} \text{ for } i = 0, 1, \ldots, 2k-1.$$

Note that because t>k, the number of syndromes in the second set of syndromes 121 is less than the number of syndromes in the first set of syndromes 111.

Figure 2:
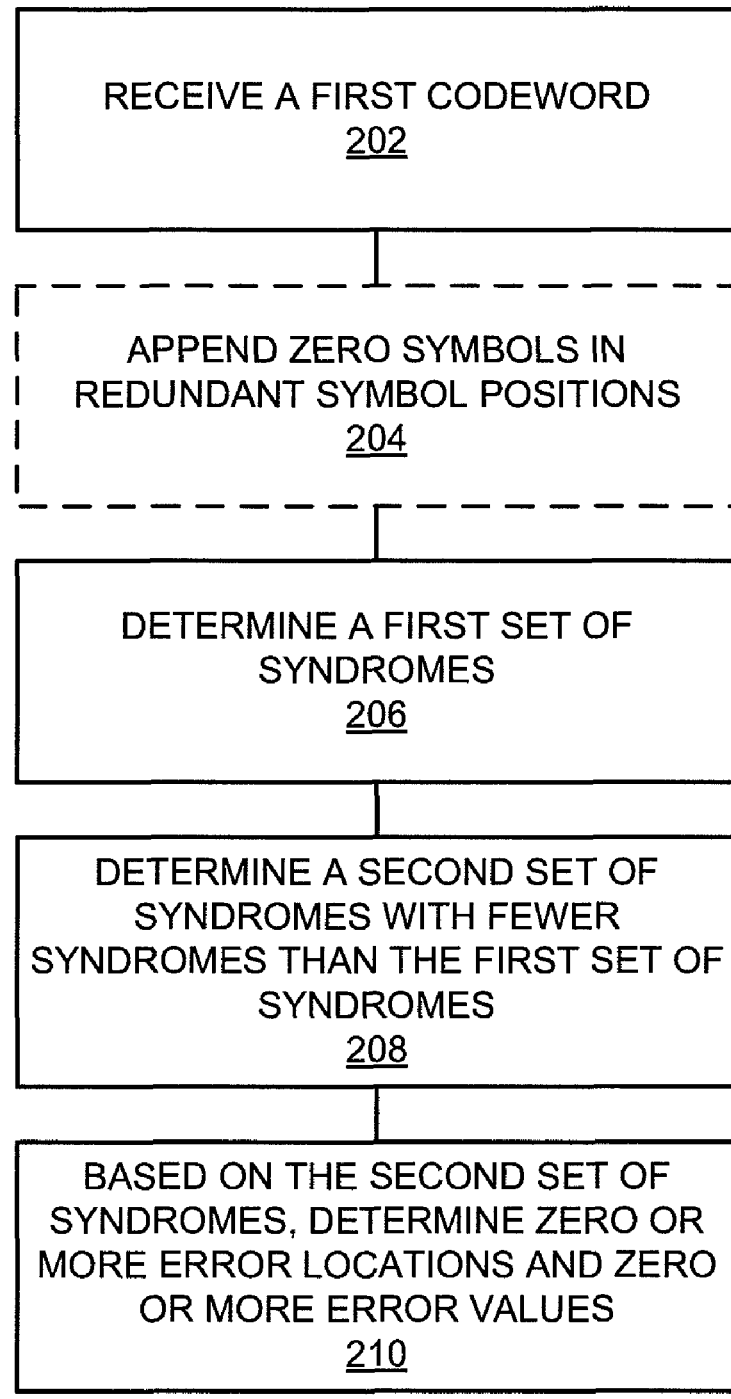
FIG. 2 is a flowchart illustrating a method of Reed-Solomon decoding.

FIG. 2 is a flowchart illustrating a method of Reed-Solomon decoding. The steps illustrated in FIG. 2 may be performed by one or more elements of Reed-Solomon decoder 100.

A first codeword is received (202). For example, Reed-Solomon decoder 100 may receive an input codeword 101 that contains fewer redundant symbols than the maximum number of redundant symbols that Reed-Solomon decoder 100 may be configured to decode. Zero value symbols may be appended in redundant symbol positions (204). For example, Reed-Solomon decoder 100, or syndrome calculator 110, may append zero value symbols to a smaller received input codeword to produce an input codeword 101 that matches the length of the largest code that Reed-Solomon decoder 100 can decode. This block is shown in FIG. 2 with a dashed outline to explicitly indicate it is an optional step.

To illustrate optional step 204, consider a case where the largest code that Reed-Solomon decoder 100 can decode is an RS(255,239) code. Consider further that Reed-Solomon decoder 100 receives a codeword that is encoded using a RS(251,239) code. Reed-Solomon decoder 100 or syndrome calculator 110 may append four (255−251=4) zero symbols to the received codeword. This allows syndrome calculator 110 to calculate the first set of syndromes 111 as if the received codeword was encoded with a RS(255, 239) code.

To further illustrate optional step 204, consider a received codeword of the maximum size code RS(255,239) to be the set of symbols: $M=(m_0, m_1, \ldots, m_{239}, m_{240}, \ldots, m_{254})$ where symbols $m_{240}$ through $m_{254}$ are redundant (i.e., parity) symbols. Consider the received codeword of an RS(251,239) code to be the set of symbols: $R=(r_0, r_1, \ldots, r_{239}, r_{240}, \ldots, r_{250})$. Reed-Solomon decoder 100 or syndrome calculator 110 may append zero symbols to the received codeword such that: $\tilde{R}=(r_0, r_1, \ldots, r_{239}, r_{240}, \ldots, r_{250}, 0, 0, 0, 0)$ which is a size that matches the input of syndrome calculator 110. Thus, syndrome calculator 110 may calculate the first set of syndromes as if the received codeword was encoded with a RS(255, 239) code.

A first set of syndromes is determined (206). For example, syndrome calculator 110 may produce a first set of syndromes 111. Syndrome calculator 110 may produce the first set of syndromes 111 from a shortened input codeword 101. Optionally, syndrome calculator 110 may produce the first set of syndromes 111 from an input codeword that has zero symbol values appended in redundant symbol positions.

A second set of syndromes with fewer syndromes than the first set of syndromes is determined (208). For example, syndrome transform 120 may produce the second set of syndromes 121 based on the first set of syndromes 111. The second set of syndromes 121 may have a fewer number of syndromes than the first set of syndromes 111.

In an embodiment, the second set of syndromes is determined by multiplying each of the first set of syndromes by a corresponding transform coefficient. These transform coefficients are based on the coefficients of the polynomial:

$$\Psi(x) = \prod_{i=1}^{2t-2k} (x - B_i)$$

where t is one-half of the quantity of the number of redundant symbols in the received codeword plus the number of zero symbols that optionally may be appended to the received codeword, and k is one-half the number of redundant symbols in the received codeword. The set of $B_i$ are indicators of the location of optionally appended zero value redundant symbols. The $\Psi(x)$ polynomial may be referred to as an erasure polynomial.

The transform coefficients, denoted $\psi_i$, are determined according to the equation:

$$\prod_{i=1}^{2t-2k}(x-B_i) = \sum_{i=0}^{2t-2k}\psi_i x^{2t-2k-i}.$$

The first set of syndromes may be denoted $S_i$, where: $S_i=(S_0, S_1, \ldots S_{2t-1})$. The second set of syndromes may be denoted $\tilde{S}_i$ where $S_i=(\tilde{S}_0, \tilde{S}_1, \ldots \tilde{S}_{2k-1})$. The second set of syndromes may be created according to:

$$\tilde{S}_i = \sum_{i=0}^{2t-2k}\psi_r S_{i+(2t-2k)-r} \text{ for } i=0,1,\ldots,2k-1.$$

Note that because t>k, the number of syndromes in the second set of syndromes is less than the number of syndromes in the first set of syndromes.

Based on the second set of syndromes, zero or more error locations and zero or more error values are determined (210). For example, based on the second set of syndromes 121, key equation solver 130 may determine zero or more error locations and zero or more error values. The zero or more error locations and zero or more error values may be sent to an error correction function. The zero or more error locations and zero or more error values may be sent to the error correction function using zero or more indicators of error location and zero or more indicators of error value.

Figure 3:
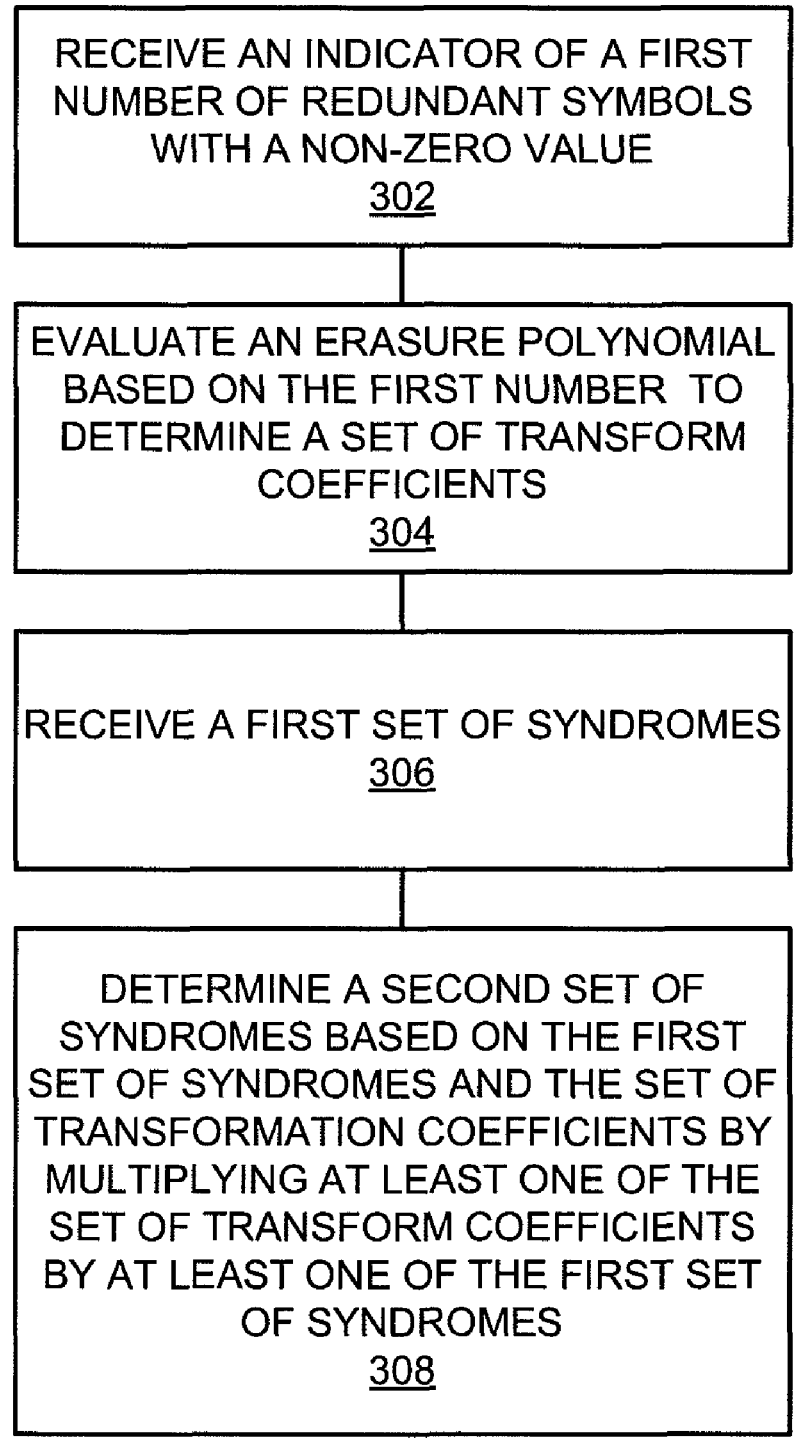
FIG. 3 is a flowchart illustrating a method of transforming syndromes.

FIG. 3 is a flowchart illustrating a method of transforming syndromes. The steps illustrated in FIG. 3 may be performed by one or more elements of Reed-Solomon decoder 100. For example, the steps illustrated in FIG. 3 may be performed by syndrome transform 120.

An indicator of a first number of redundant symbols with a non-zero value is received (302). For example, syndrome transform 120 may receive indicator of maximum error limit 102. The indicator of maximum error limit 102 may tell syndrome transform 120 the maximum number of actual errors that can be corrected. From this information, syndrome transform 120 may deduce how many of the redundant symbol positions in an input codeword contain non-zero redundant symbols, and how many contain zero symbol values.

To illustrate, consider a Reed-Solomon decoder that is configured to receive at most a RS(255,239) code. This decoder receives an input codeword that was encoded with a RS(247,239) code. The indicator of maximum error limit would tell the system that at most four ((247−239)÷2=4) errors can be corrected. From this result, it may be deduced that eight (255−(4*2)−247=8) redundant symbol positions of the input are set to zero symbol values and eight (4*2=8) would contain non-zero values.

An erasure polynomial is evaluated based on the first number to determine a set of transform coefficients (304). For example, the erasure polynomial $$\Psi(x) = \prod_{i=1}^{2t-2k}(x-B_i)$$

may be evaluated according to the equation:

$$\prod_{i=1}^{2t-2k}(x-B_i) = \sum_{i=0}^{2t-2k}\psi_i x^{2t-2k-i}$$

to produce a set of transform coefficients $\psi=(\psi_0, \psi_1, \ldots, \psi_{2t-2k})$ where t is error correcting capability of the largest code that the Reed-Solomon decoder can decode, and k is the error correcting capability of the Reed-Solomon code of a received codeword. The set of $B_i$ are indicators of the location of the zero value redundant symbols that are appended to a received codeword.

A first set of syndromes are received (306). For example, syndrome transform 120 may receive a first set of syndromes 111. These syndromes may be the result of calculating syndromes for a shorter codeword that has zero value symbols appended to it to make a longer codeword.

A second set of syndromes is determined based on the first set of syndromes and the set of transform coefficients by multiplying at least one of the set of transformation coefficients by at least one of the first set of syndromes (308). For example, syndrome transform 120 may determine a second set of syndromes 121 based on the first set of syndromes 111. Syndrome transform 120 may create the second set of syndromes by multiplying at least one of the set of transform coefficients created in step 304 by at least one of the first set of syndromes 111.

The first set of syndromes may be denoted $S_i$, where: $S_i=(S_0, S_1, \ldots S_{2t-1})$. The second set of syndromes may be denoted $\tilde{S}_i$ where: $\tilde{S}_i=(\tilde{S}_0, \tilde{S}_1, \ldots \tilde{S}_{2k-1})$. The second set of syndromes may be determined according to the equation:

$$\tilde{S}_i = \sum_{i=0}^{2t-2k}\psi_r S_{i+(2t-2k)-r} \text{ for } i=0,1,\ldots,2k-1.$$

Note that because t>k, the number of syndromes in the second set of syndromes is less than the number of syndromes in the first set of syndromes.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:
1. A Reed-Solomon decoder, comprising:
a syndrome calculator that receives an input codeword and calculates a first set of syndromes, the input codeword having a set of information symbols and a set of redundant symbols, the set of redundant symbols consisting of a set of zero symbols in first redundant symbol positions and a set of non-zero redundant symbols in second redundant symbol positions;
a syndrome transform that receives the first set of syndromes having a first number of syndromes and deter- mines a second set of syndromes based on the first set of syndromes, the second set of syndromes having a second number of syndromes, the first number of syndromes greater than the second number of syndromes, the syndrome transform receiving an indicator of a maximum number of errors, the indicator of the maximum number of errors determining a transform of the first set of syndromes into the second set of syndromes; and, a key equation solver that receives the second set of syndromes and produces an indication of zero or more error locations and an indication of zero or more error values, the indication of zero or more error locations not including the first redundant symbol positions.

2. The Reed-Solomon decoder of claim 1, wherein the key equation solver can produce the indication of error location for up to a first number of errors.

3. The Reed-Solomon decoder of claim 2, wherein the syndrome transform block receives the indicator of a maximum number of errors that is to be less than the first number of errors.

4. The Reed-Solomon decoder of claim 3, wherein the syndrome calculator receives an input codeword with a number of redundant symbols that equals two times the maximum number of errors.

5. The Reed-Solomon decoder of claim 4, wherein the syndrome calculator receives an input codeword with a number of zero symbols that equals two times the first number of errors minus two times the maximum number of errors.

6. The Reed-Solomon decoder of claim 5, wherein syndrome transform produces the second set of syndromes from the first set of syndromes by multiplying at least the second number of syndromes by a set of transform coefficients.

7. The Reed-Solomon decoder of claim 6, wherein the transform coefficients are based on the coefficients of the polynomial:

$$\Psi(x) = \prod_{i=1}^{2t-2k} (x - B_i)$$

where t is the first number of errors and k is the maximum number of errors, and $B_i$ are indicators of the locations of the zero symbols.

8. The Reed-Solomon decoder of claim 7, wherein the transform coefficients ($\psi_i$) are determined from the equation:

$$\prod_{i=1}^{2t-2k} (x - B_i) = \sum_{i=0}^{2t-2k} \psi_i x^{2t-2k-i}.$$

9. A method of Reed-Solomon decoding, comprising:

receiving a first codeword having a set of information symbols and a set of redundant symbols, the set of information symbols having a first number of information symbols, the set of redundant symbols having a second number of redundant symbols, the set of redundant symbols consisting of a set of zero symbols in first redundant symbol positions and a set of non-zero redundant symbols in second redundant symbol positions;

determining a first set of syndromes having a third number of syndromes equal to the second number plus the first number;

receiving an indicator of a maximum number of errors;

determining, based on the indicator of the maximum number of errors, a second set of syndromes, wherein the number of syndromes in the second set of syndromes is equal to the second number; and, based on the second set of syndromes, determining an indication of zero or more error locations and an indication of zero or more error values, the indication of zero or more error locations not including the first redundant symbol positions.

10. The method of claim 9, further comprising:

determining a set of transform coefficients based on the indicator of the second number of symbols; and, wherein the second set of syndromes is determined by multiplying at least one of the set of transform coefficients by at least one of the first set of syndromes.

11. The method of claim 10, further comprising:

evaluating an erasure polynomial to determine the set of transform coefficients.

12. The method of claim 11, wherein the erasure polynomial ($\psi(x)$) is based on:

$$\Psi(x) = \prod_{i=1}^{2t-2k} (x - B_i)$$

where t is one-half of the third number and k is one-half the second number, and $B_i$ are indicators of locations of a fourth number of zero symbols that are in redundant symbol positions.

13. The method of claim 12, wherein the set of transform coefficients ($\psi_i$) are determined from the equation:

$$\prod_{i=1}^{2t-2k} (x - B_i) = \sum_{i=0}^{2t-2k} \psi_i x^{2t-2k-i}.$$

14. A method of transforming syndromes, comprising:

receiving a first indicator of a first number of redundant symbols having a non-zero symbol value;

receiving an indicator of a maximum number of errors;

determining a set of transform coefficients based on the first number and the maximum number of errors;

receiving a first set of syndromes; and, determining a second set of syndromes based on the first set of syndromes and the set of transform coefficients, wherein the first set of syndromes has a first number of syndromes, the second set of syndromes has a second number of syndromes, and the first number is greater than the second number.

15. The method of claim 14, wherein the number of transform coefficients in the set of transform coefficients is a maximum number of redundant symbols minus the first number of redundant symbols, plus one.

16. The method of claim 15, further comprising:

evaluating an erasure polynomial to determine the set of transform coefficients; and, wherein the second set of syndromes is determined by multiplying at least one of the set of transform coefficients by at least one of the first set of syndromes.

17. The method of claim 16, wherein the erasure polynomial ($\psi(x)$) is based on:

$$\Psi(x) = \prod_{i=1}^{2t-2k} (x - B_i)$$

where t is one-half the maximum number of redundant symbols and k is one-half the a second number of syndromes, and $B_i$ are indicators of locations of redundant symbol positions containing zero value symbols.

18. The method of claim 17, wherein the set of transform coefficients ($\psi_i$) are determined from the equation:

$$\prod_{i=1}^{2t-2k} (x - B_i) = \sum_{i=0}^{2t-2k} \psi_i x^{2t-2k-i}.$$

* * * * *